US008045389B2

(12) United States Patent
Kanehara et al.

(10) Patent No.: US 8,045,389 B2
(45) Date of Patent: Oct. 25, 2011

(54) SEMICONDUCTOR MEMORY DEVICE

(75) Inventors: Hidenari Kanehara, Kyoto (JP); Yasuhiro Agata, Osaka (JP); Norihiko Sumitani, Osaka (JP); Akira Masuo, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/949,346

(22) Filed: Nov. 18, 2010

(65) Prior Publication Data

US 2011/0063928 A1 Mar. 17, 2011

Related U.S. Application Data

(63) Continuation of application No. PCT/JP2010/000649, filed on Feb. 3, 2010.

(30) Foreign Application Priority Data

Jun. 24, 2009 (JP) ................................ 2009-149529

(51) Int. Cl.
*G11C 11/34* (2006.01)

(52) U.S. Cl. .............. 365/185.2; 365/210.1; 365/185.09

(58) Field of Classification Search ............... 365/185.2, 365/210.1, 185.09
See application file for complete search history.

(56) References Cited

U.S. PATENT DOCUMENTS 6,111,805 A 8/2000 Furutani
2005/0024956 A1 * 2/2005 Tran et al. ..................... 365/200
2005/0286323 A1 12/2005 Ohtsuki et al.
2008/0175040 A1 7/2008 Kushida et al.

FOREIGN PATENT DOCUMENTS

JP 63-209094 8/1988
JP 11-353870 12/1999
JP 2006-012240 1/2006
JP 2008-177360 7/2008
JP 2009-116931 5/2009

* cited by examiner

*Primary Examiner* — Jason Lappas
(74) *Attorney, Agent, or Firm* — McDermott Will & Emery LLP

(57) ABSTRACT

A dummy cell array is provided in a memory cell array, and an intermediate buffer is provided between input/output circuits, whereby control signals to the input/output circuits can be operated at high speed and with a high frequency while the area increasing effect is reduced even in a memory with a large bit width.

11 Claims, 23 Drawing Sheets

ROW DECODER 600
CONTROL CIRCUIT 500
SIG0
MEMORY CELL ARRAY 101
SIGm-1
DUMMY CELL ARRAY 201
SIGm
INTERMEDIATE BUFFER 300
MEMORY CELL ARRAY 101
SIGm+n-1
400
400
400
400
400
400

ROW DECODER 600
MEMORY CELL ARRAY 101
DUMMY CELL ARRAY 201
MEMORY CELL ARRAY 101
CONTROL CIRCUIT 500
INTERMEDIATE BUFFER 300
SIG0
SIGm-1
SIGm
SIGm+n-1
400
400
400
400
400
400

WL
WL
BL
NBL
DBL
NDBL
BL
NBL
MEMORY CELL 100
DUMMY CELL 200
MEMORY CELL 100
VDD
VSS
MP1
MP2
MN1
MN2
MN3
MN4
100
200
100

WL
WL
BL
NBL
DBL
NDBL
BL
NBL
MEMORY CELL 100
DUMMY CELL 200
MEMORY CELL 100
VDD
VSS
MP1
MP2
MN1
MN2
MN3
MN4
MP3
MP4
100
200
100
PCL
PCR

WL
BL
NBL
DBL
NDBL
MEMORY CELL
100
DUMMY CELL
200
VDD
VSS
MP1
MP2
MP3
MP4
MP5
MP6
MN1
MN2
MN3
MN4
PCL
PCR
LOW
100
200

BL
DBL
BL
MEMORY CELL 100
DUMMY CELL 200
MEMORY CELL 100
102
202
102
VSS
VSS
VSS
100
200
100
MN5
HIGH

WL
WL
BL
NBL
DBL
NDBL
BL
NBL
MEMORY CELL 100
DUMMY CELL 200
MEMORY CELL 100
VDD
MP1
MP2
MN1
MN2
MN3
MN4
VSS
100
200
MP3
MP4
MP5
MN5
PCL
PCR
LOW
HIGH

WL
WL
BL
NBL
DBL
NDBL
BL
NBL
MEMORY CELL
100
DUMMY CELL
200
MEMORY CELL
100
VDD
MP1
MP2
MN1
MN2
MN3
MN4
VSS
MP3
MP4
100
200
PCL
PCR

WL
BL
NBL
DBL
NDBL
MEMORY CELL 100
DUMMY CELL 200
MP1
MP2
MN1
MN2
MN3
MN4
VDD
VSS
100
200
MP3
MP4
PCL
PCR

WL
BL
NBL
TBL
NTBL
PCL
PCR
MEMORY CELL
100
DUMMY CELL
200
VDD
VSS
MP1
MP2
MP3
MP4
MN1
MN2
MN3
MN4
100
200

WL
BL
NBL
DBL
NDBL
MEMORY CELL 100
DUMMY CELL 200
VDD
VSS
MP1
MP2
MP3
MP4
MN1
MN2
MN3
MN4
MP8
MP9
MP10
MP11
MN8
MN9
MN10
MN11
100
200
PCL
PCR

MEMORY CELL 100
DUMMY CELL 200
DUMMY CELL 200
MEMORY CELL 100
BL
NBL
DBL
NDBL
WL
PCL
PCR
VDD
VSS
MP1
MP2
MP3
MP4
MN1
MN2
MN3
MN4
MP12
MN12
MP13
MN13
MP14
MN14
MP15
MN15
100
200

WL
BL
NBL
DBL
NDBL
VDD
VSS
MP1
MP2
MN1
MN2
MN3
MN4
100
200
PCL
PCR
MP3
MP4
REL
RER
MP21
MP22
MP16
MP17
MN16
MN17
MN18
900
901
902
903
904
SAE
SAEL
SAER

WL
PCL
PCR
REL
RER
SAE
BL
NBL
DBL
SAEL
SAER
VDD
VSS
TIME

SEMICONDUCTOR MEMORY DEVICE

CROSS-REFERENCE TO RELATED APPLICATIONS

This is a continuation of PCT International Application PCT/JP2010/000649 filed on Feb. 3, 2010, which claims priority to Japanese Patent Application No. 2009-149529 filed on Jun. 24, 2009. The disclosures of these applications including the specifications, the drawings, and the claims are hereby incorporated by reference in their entirety.

BACKGROUND

The present disclosure relates to techniques of increasing the speed of semiconductor memory devices.

When a memory having a large bit width is operated at high speed, an interconnect resistance, an interconnect capacitance, and a gate capacitance occurring during transmission of a control signal for an input/output circuit, such as a sense amplifier activation signal, a bit line precharge signal, a column decode signal, etc., increases, and therefore, a waveform has more difficulty in increasing or decreasing in further subsequent stages. To address this problem, there is a known technique of supplying a control signal via a repeater to increase the speed (see, for example, Japanese Patent Publication No. H11-353870).

In conventional memories having a typical configuration, an interconnect resistance, an interconnect capacitance, and a gate capacitance occurring during transmission of a control signal for an input/output circuit, such as a sense amplifier activation signal, a bit line precharge signal, a column decode signal, etc., increase with an increase in the bit width, and therefore, it is difficult to increase the speed.

Moreover, when a repeater is employed as in Japanese Patent Publication No. H11-353870, the repeater is provided in a region other than regions in which a sense amplifier or a column decoder is provided and which have a pitch corresponding to that of memory cells. Therefore, memory cells cannot be provided around the repeater, and therefore, a region around the repeater is dead space. The increase in the speed thus leads to an increase in the area.

SUMMARY

In an example semiconductor memory device according to the present disclosure, dummy cells are provided in a bit line direction in a memory cell array, and an intermediate buffer is provided in an intersection region between a region extended from the dummy cells and input/output circuits. As a result, control signals to the input/output circuits can be operated at high speed while the continuity of memory cells is not impaired and the increase in the area is minimized.

According to the semiconductor memory device of the present disclosure, the intermediate buffer for the control signals to the input/output circuits is provided in the intersection region between the region extended from the dummy cell region provided in the memory cell array and the input/output circuits, whereby the control signals to the input/output circuits can be operated at high speed. Moreover, the dummy cells are provided in a region corresponding to the intermediate buffer of the memory cell array, whereby the increase in the area can be minimized while the continuity of the memory cells is not impaired.

DETAILED DESCRIPTION

Figure 1:
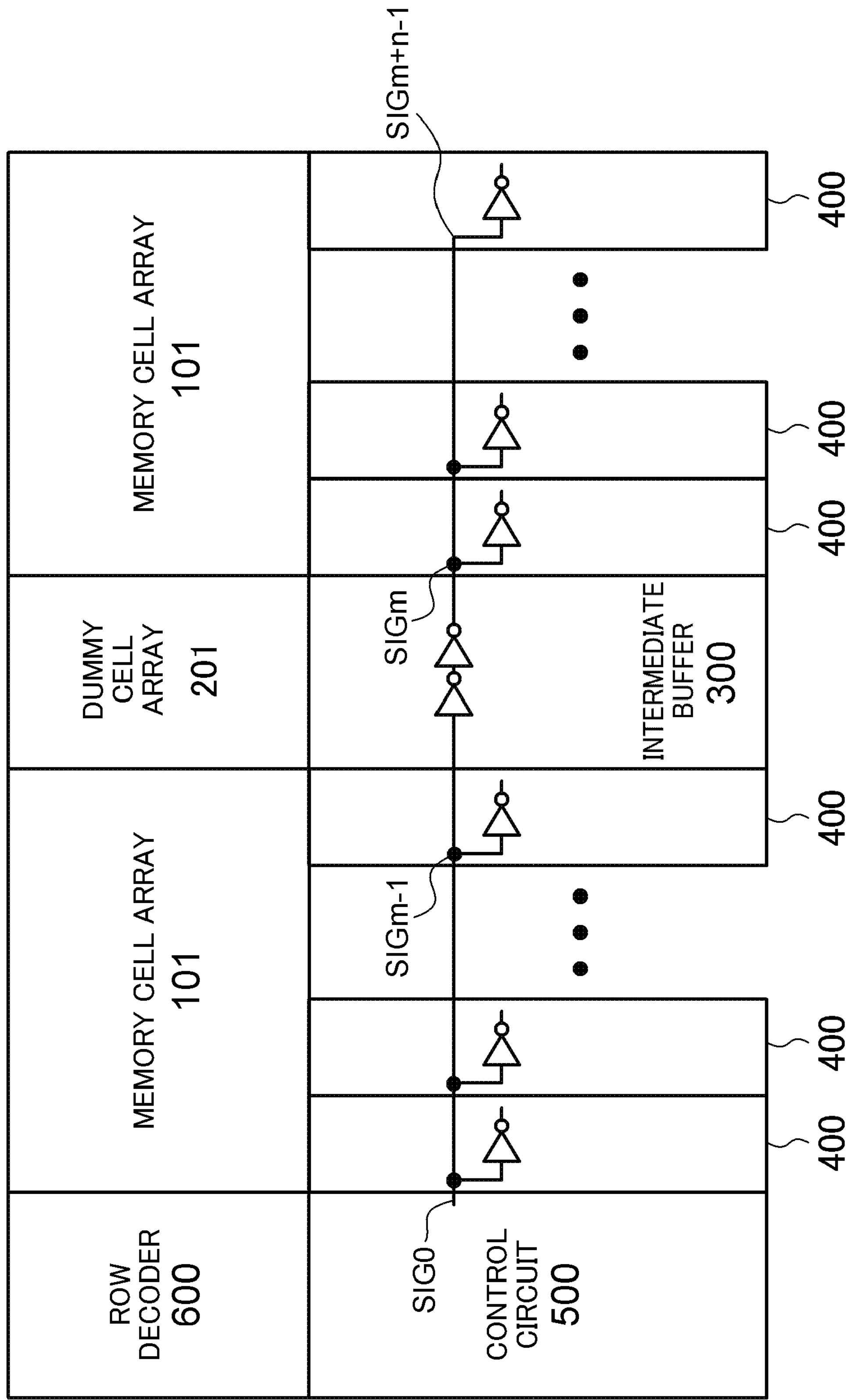
FIG. 1 is a circuit diagram of a first embodiment of the present disclosure.

FIG. 1 is a diagram showing a configuration of a semiconductor memory device according to an embodiment of the present disclosure. The semiconductor memory device is a memory of an (m+n) bit width including a memory cell array 101, a dummy cell array 201, an intermediate buffer 300, input/output circuits 400, a control circuit 500, and a row decoder 600. Please note that m and n are integers. The intermediate buffer 300 is provided and interposed between the input/output circuit 400 at the m-th bit and the input/output circuit 400 at the (m+1)th bit. The dummy cell array 201, in which dummy cells are arranged in a bit line direction, is provided at a position corresponding to the intermediate buffer 300 in the memory cell array 101. Representative control signals for the input/output circuits 400 are indicated by SIG0-SIGm+n−1, which also indicate nodes located in the respective input/output circuits 400. For example, the control signals are a sense amplifier activation signal, a bit line precharge signal, a column decode signal, etc. SIGm is located two gate stages away from SIGm−1 so that SIGm−1 is buffered by the intermediate buffer 300.

Figure 2:
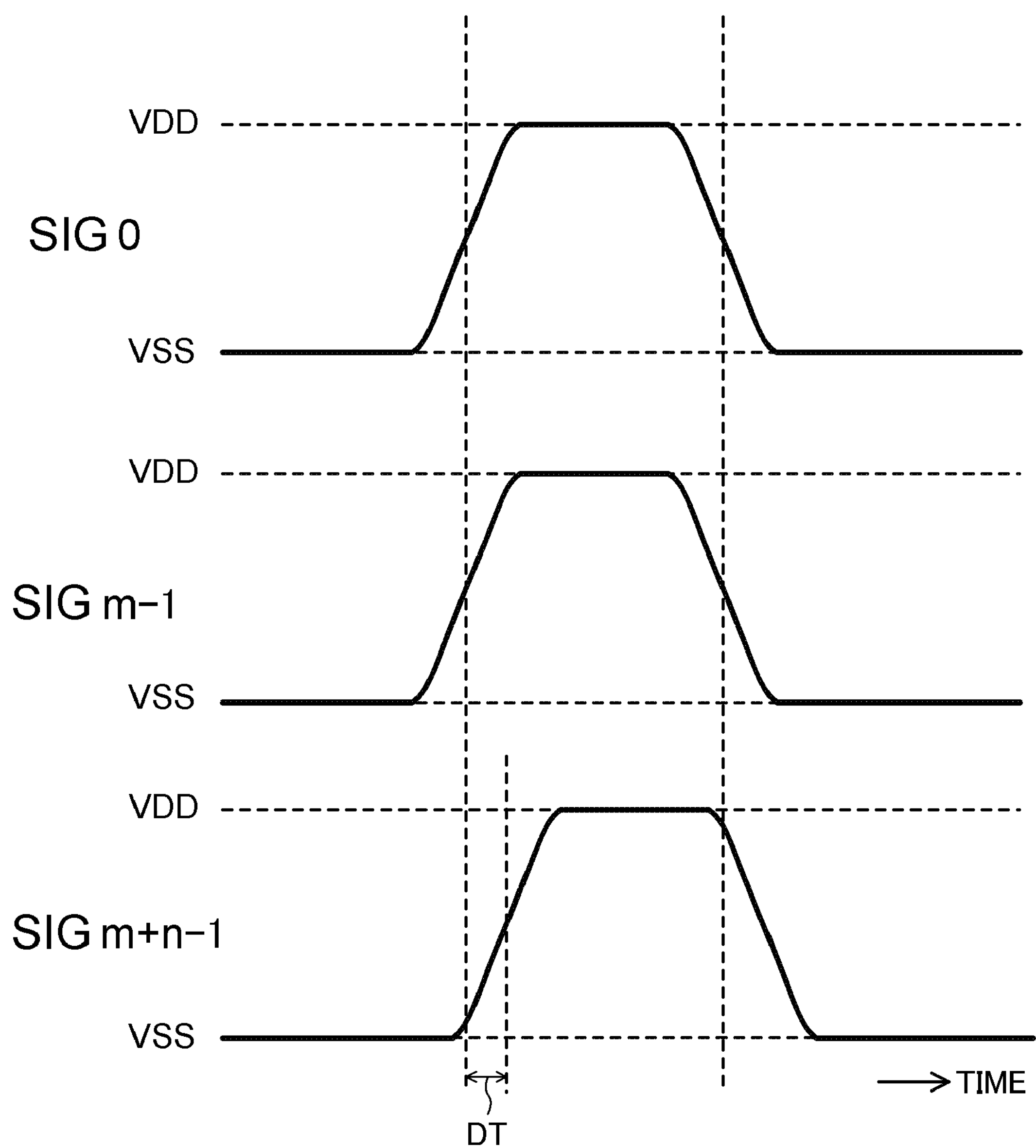
FIG. 2 is a circuit operation diagram of the first embodiment of the present disclosure.

FIG. 2 shows waveforms of SIG0-SIGm+n−1 of the circuit of FIG. 1. Even when the bit width of m+n is large and the semiconductor memory device operates at high speed, SIG0-SIGm+n−1 can be increased to VDD or decreased to VSS sufficiently quickly because the intermediate buffer 300 is provided between the input/output circuit 400 at the m-th bit and the input/output circuit 400 at the (m+1)th bit. Note that a delay DT corresponding to two gate stages occurs in SIGm-SIGm+n−1 with reference to SIG0-SIGm−1. This applies to a case where the input/output circuit 400 is an output circuit or an input circuit.

Figure 3:
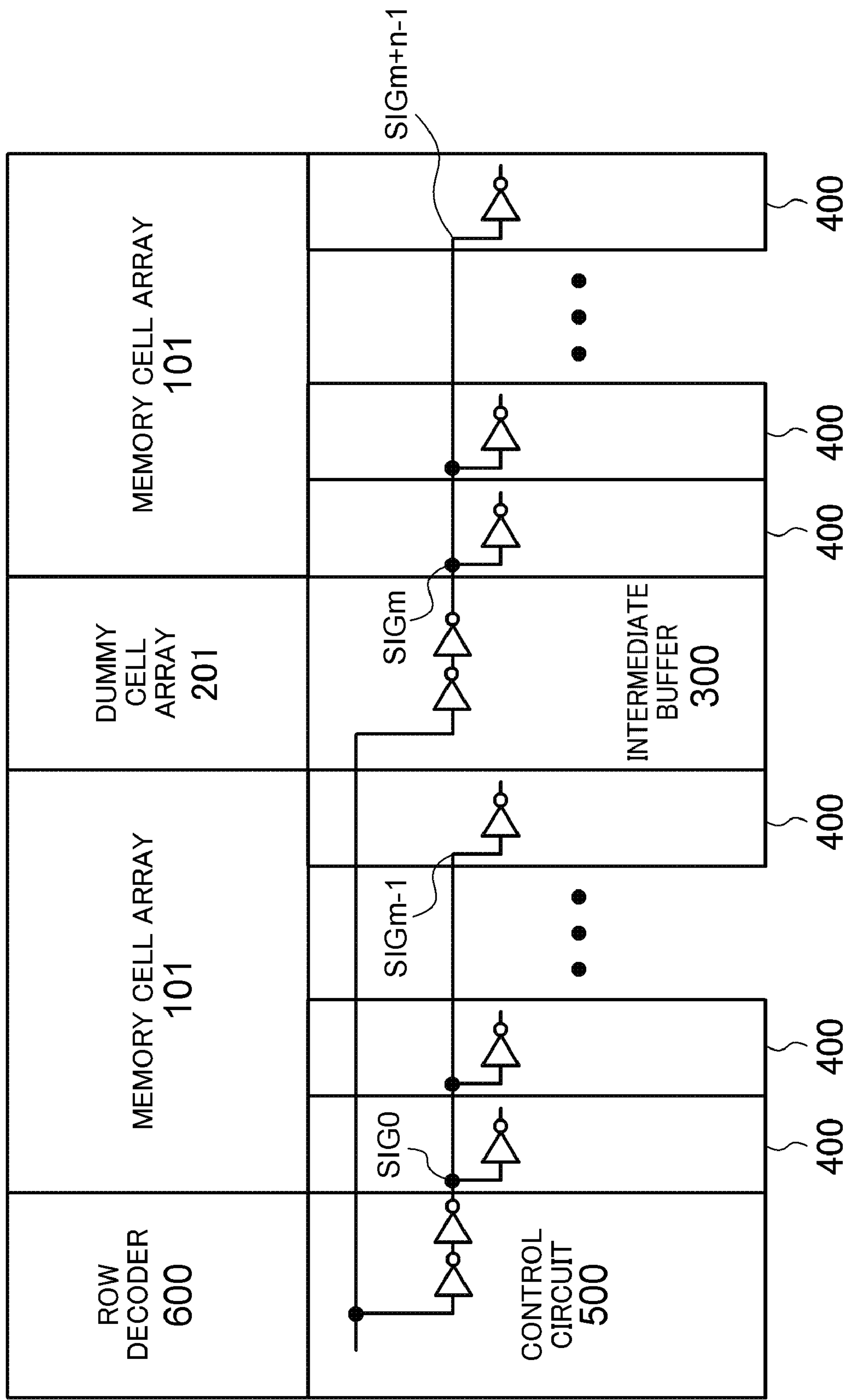
FIG. 3 is a circuit diagram of a second embodiment of the present disclosure.

FIG. 3 is a diagram showing a configuration of a semiconductor memory device according to another embodiment of the present disclosure. The semiconductor memory device is a memory of an (m+n) bit width including a memory cell array 101, a dummy cell array 201, an intermediate buffer 300, input/output circuits 400, a control circuit 500, and a row decoder 600. The intermediate buffer 300 is provided and interposed between the input/output circuit 400 at the m-th bit and the input/output circuit 400 at the (m+1)th bit. The dummy cell array 201, in which dummy cells are arranged in a bit line direction, is provided at a position corresponding to the intermediate buffer 300 in the memory cell array 101. Representative control signals for the input/output circuits 400 are indicated by SIG0-SIGm+n−1, which also indicate nodes located in the respective input/output circuits 400. For example, the control signals are a sense amplifier activation signal, a bit line precharge signal, a column decode signal, etc. A buffer circuit for regulating delays in SIG0-SIGm+n−1 is provided in each of the control circuit 500 and the intermediate buffer 300 so that all the delays in SIG0-SIGm+n−1 become the same.

Figure 4:
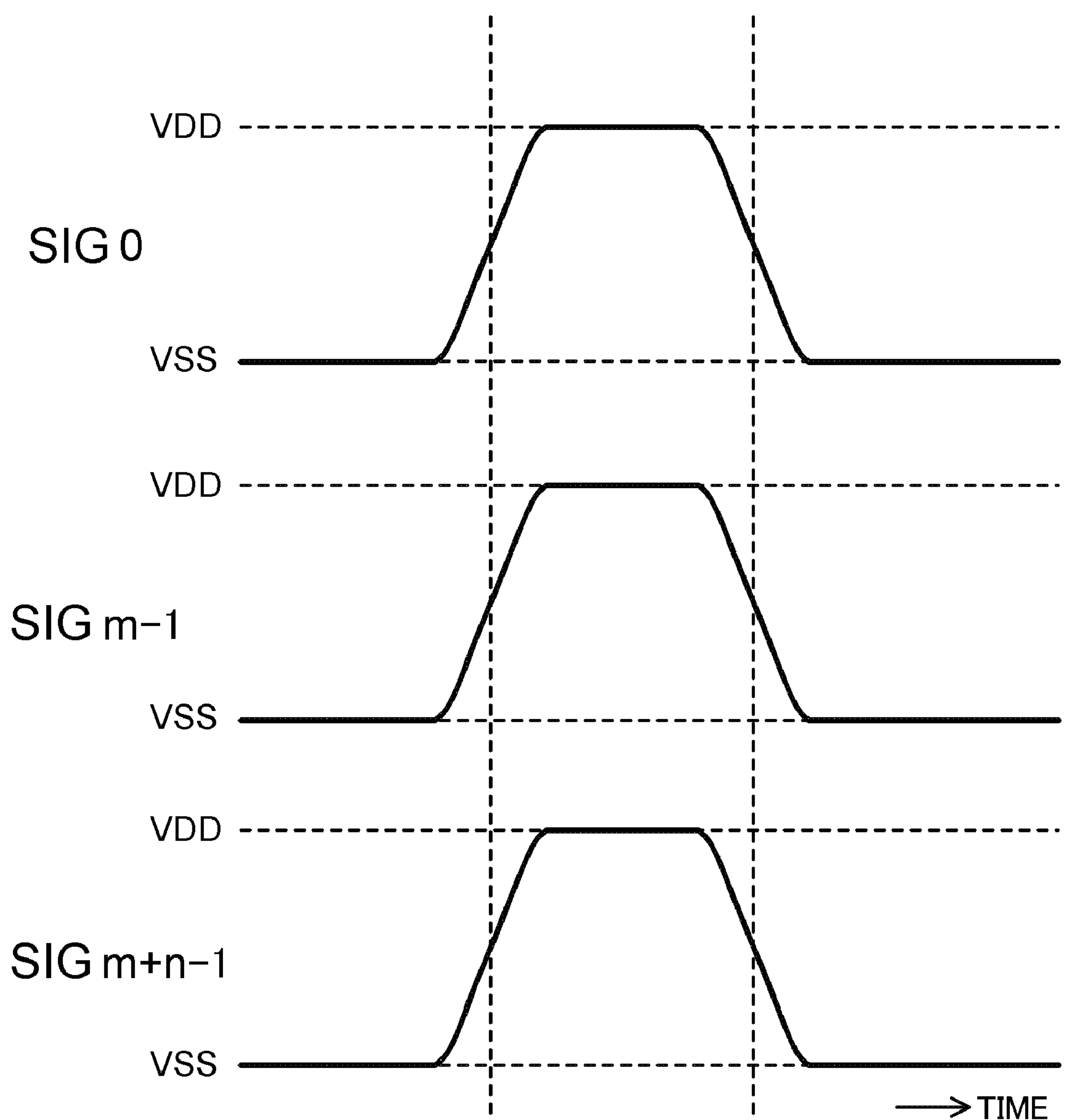
FIG. 4 is a circuit operation diagram of the second embodiment of the present disclosure.

FIG. 4 shows waveforms of SIG0-SIGm+n−1 of the circuit of FIG. 3. Even when the bit width of m+n is large and the semiconductor memory device operates at high speed, SIGm at the (m+1)th bit and SIGm+n−1 at the (m+n)th bit can be increased to VDD or decreased to VSS sufficiently quickly because a buffer circuit is provided in the control circuit 500 and the intermediate buffer 300 is provided between the input/output circuit 400 at the m-th bit and the input/output circuit 400 at the (m+1)th bit. This applies to a case where the input/output circuit 400 is an output circuit or an input circuit.

Figure 5:
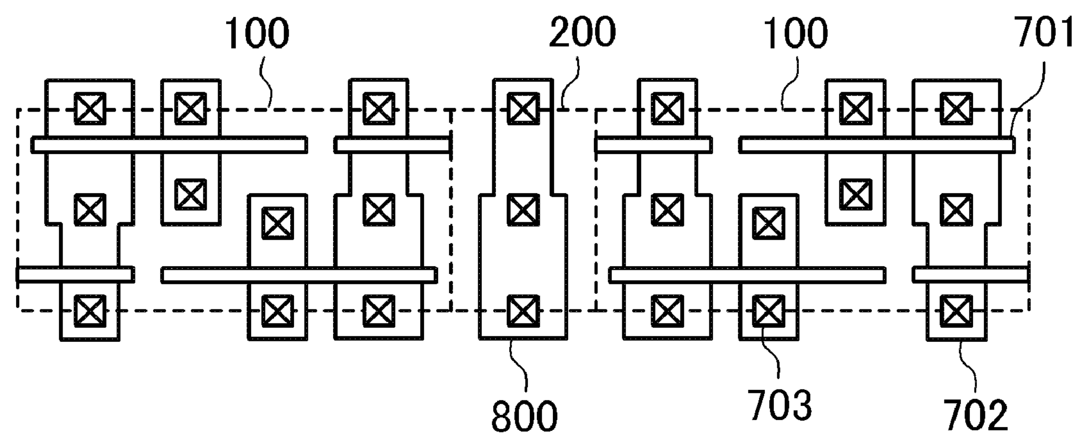
FIG. 5 is a layout diagram of a third embodiment of the present disclosure.

FIG. 5 is a diagram of a configuration of a static random access memory (SRAM) according to another embodiment of the present disclosure, showing a layout pattern of memory cells 100 included in the memory cell array 101 of FIG. 1 or 3 and a dummy cell 200 included in the dummy cell array 201 of FIG. 1 or 3. A reference character 701 indicates gates, a reference character 702 indicates diffusion layers, and a reference character 703 indicates contacts. The dummy cell 200 serves as a substrate contact 800 for the memory cells 100, and allows the intermediate buffer 300 to be provided between the corresponding input/output circuits 400 while the increase in the area is minimized. This applies to memories, such as read only memories (ROMs), dynamic random access memories (DRAMs), etc., other than SRAMs.

Figure 6:
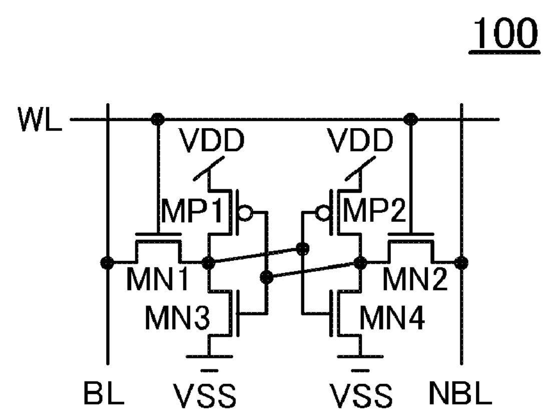
FIG. 6 is a memory cell circuit diagram of the third embodiment of the present disclosure.

FIG. 6 is a circuit diagram of the memory cell 100 in the case of SRAM. The memory cell 100 of FIG. 6 includes P-channel load transistors MP1 and MP2, N-channel access transistors MN1 and MN2, and N-channel drive transistors MN3 and MN4. A reference character WL indicates a word line, and reference characters BL and NBL indicate a pair of bit lines.

Figure 7:
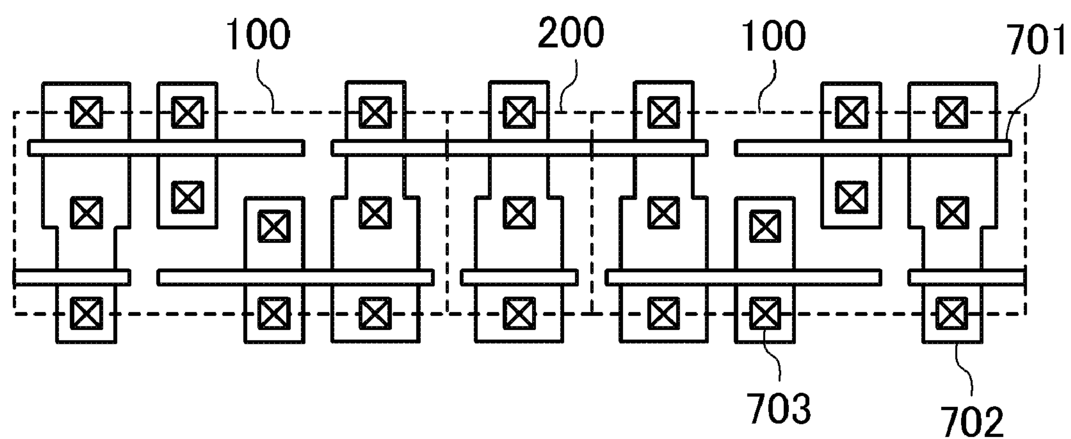
FIG. 7 is a layout diagram of a fourth embodiment of the present disclosure.

FIG. 7 is a diagram of a configuration of an SRAM according to another embodiment of the present disclosure, showing a layout pattern of memory cells 100 included in the memory cell array 101 of FIG. 1 or 3 and a dummy cell 200 included in the dummy cell array 201 of FIG. 1 or 3. A gate, a diffusion layer, and a contact of the dummy cell 200 have the same shape as that of a part of a gate, a diffusion layer, and a contact of the memory cell 100 so that the intermediate buffer 300 is provided between the corresponding input/output circuits 400 while the increase in the area is minimized without impairing the optical continuity of the memory cells 100. This applies to memories, such as ROMs, DRAMs, etc., other than SRAMs.

Figure 8:
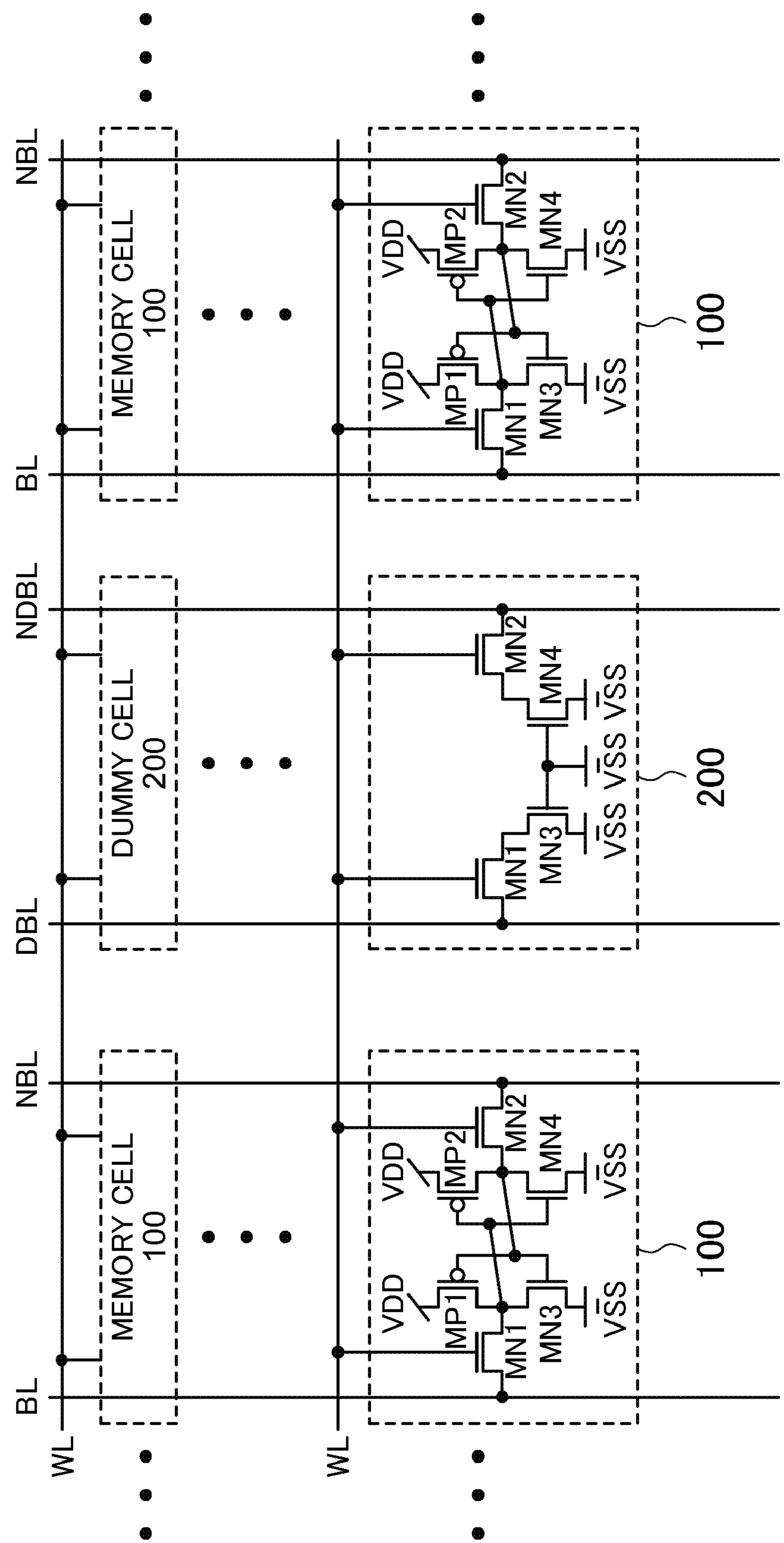
FIG. 8 is a circuit diagram of the fourth embodiment of the present disclosure.

FIG. 8 is a circuit diagram corresponding to the layout of FIG. 7. Here, in the dummy cell 200, the load transistors MP1 and MP2 are removed, and the gates of the drive transistors MN3 and MN4 are connected to VSS. Reference characters DBL and NDBL indicate a pair of dummy bit lines.

Figure 9:
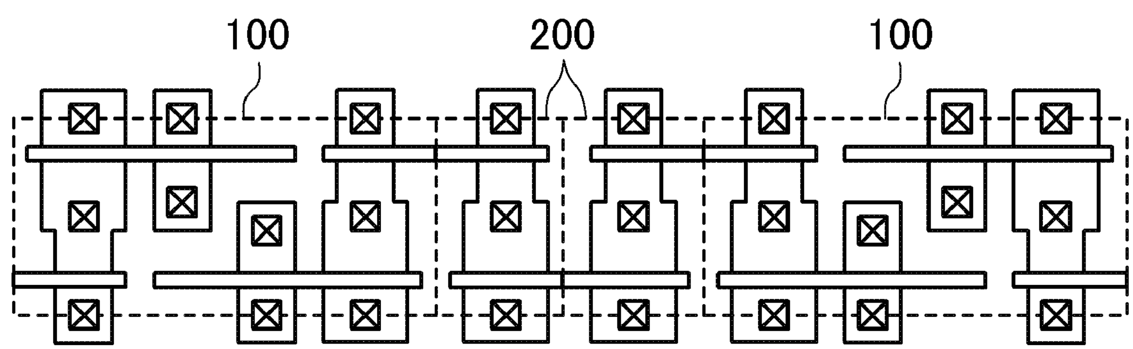
FIG. 9 is a layout diagram of the fourth embodiment of the present disclosure.

As shown in FIG. 9, two or more lines of dummy cells 200 may be provided to obtain a similar effect. This applies to memories, such as ROMs, DRAMs, etc., other than SRAMs.

Figure 10:
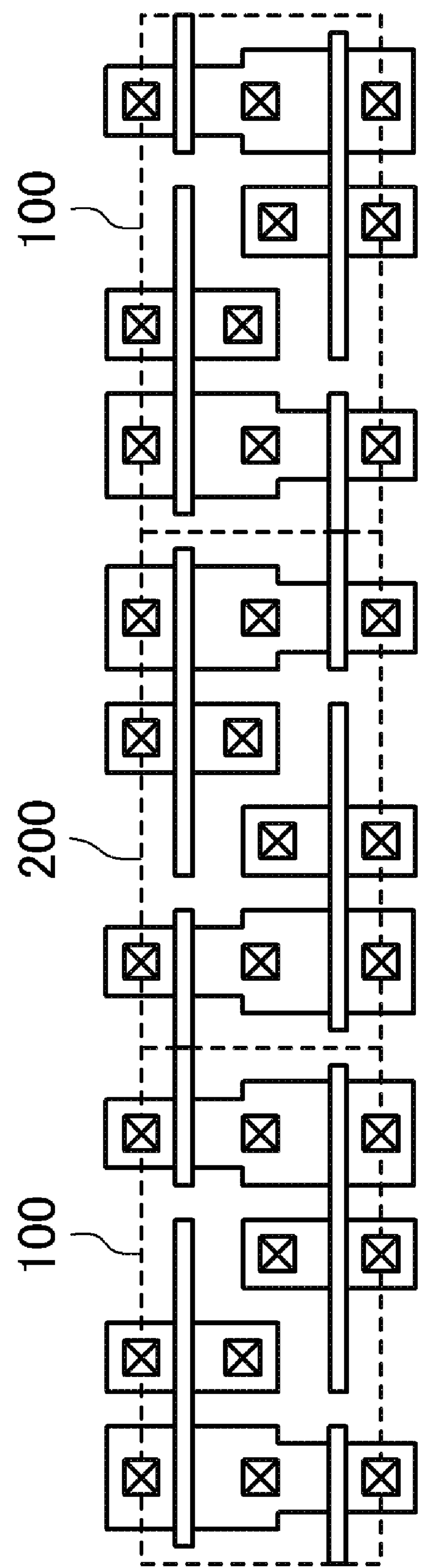
FIG. 10 is a layout diagram of a fifth embodiment of the present disclosure.

FIG. 10 is a diagram of a configuration of an SRAM according to another embodiment of the present disclosure, showing a layout pattern of memory cells 100 included in the memory cell array 101 of FIG. 1 or 3 and a dummy cell 200 included in the dummy cell array 201 of FIG. 1 or 3. A gate, a diffusion layer, and a contact of the dummy cell 200 have the same shape as that a gate, a diffusion layer, and a contact of the memory cell 100 so that the intermediate buffer 300 is provided between the corresponding input/output circuits 400 while the increase in the area is minimized without impairing the optical continuity of the memory cells 100.

Figure 11:
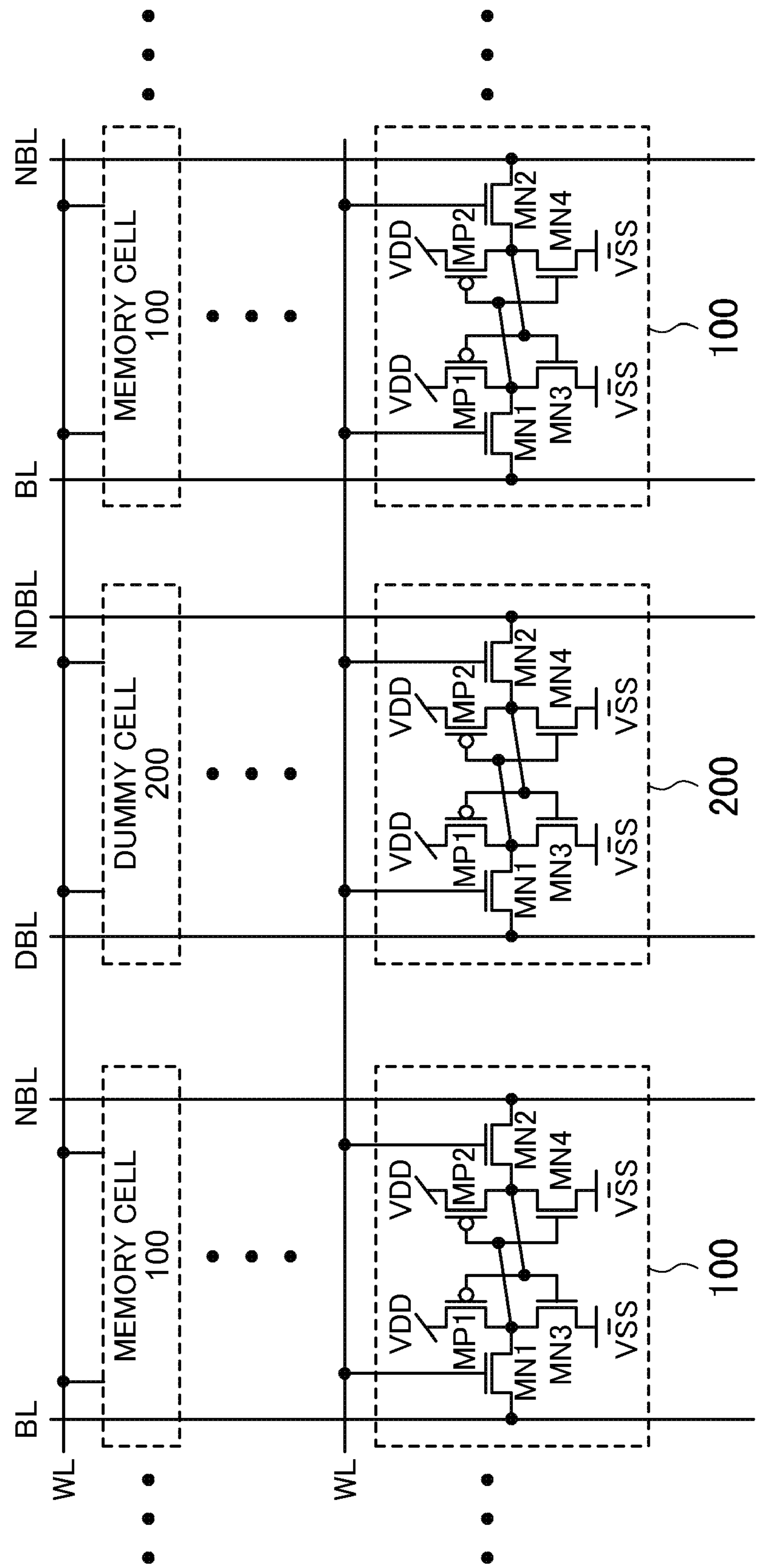
FIG. 11 is a circuit diagram of the fifth embodiment of the present disclosure.

FIG. 11 is a circuit diagram corresponding to the layout of FIG. 10. Here, the dummy cell 200 has the same internal configuration as that of the memory cell 100.

Figure 12:
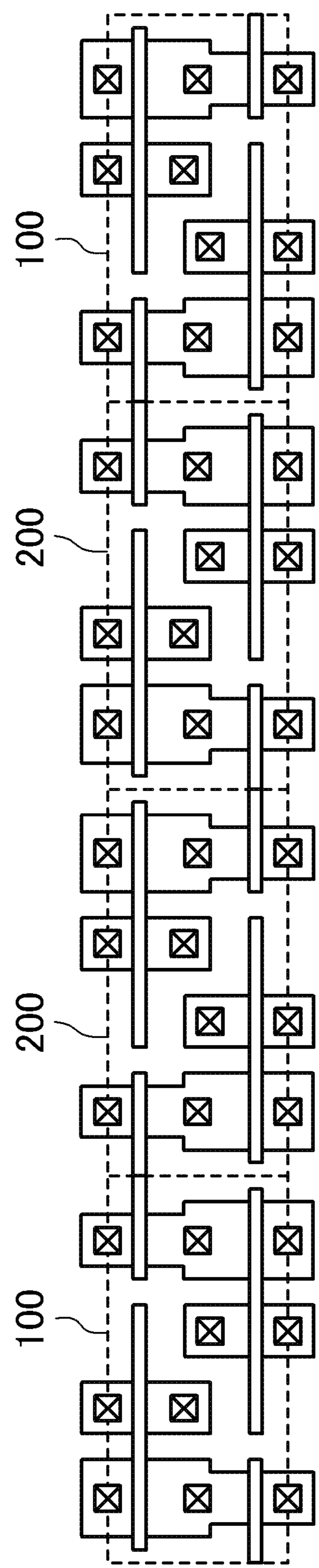
FIG. 12 is a layout diagram of the fifth embodiment of the present disclosure.

As shown in FIG. 12, two or more lines of dummy cells 200 may be provided to obtain a similar effect. This applies to memories, such as ROMs, DRAMs, etc., other than SRAMs.

Figure 13:
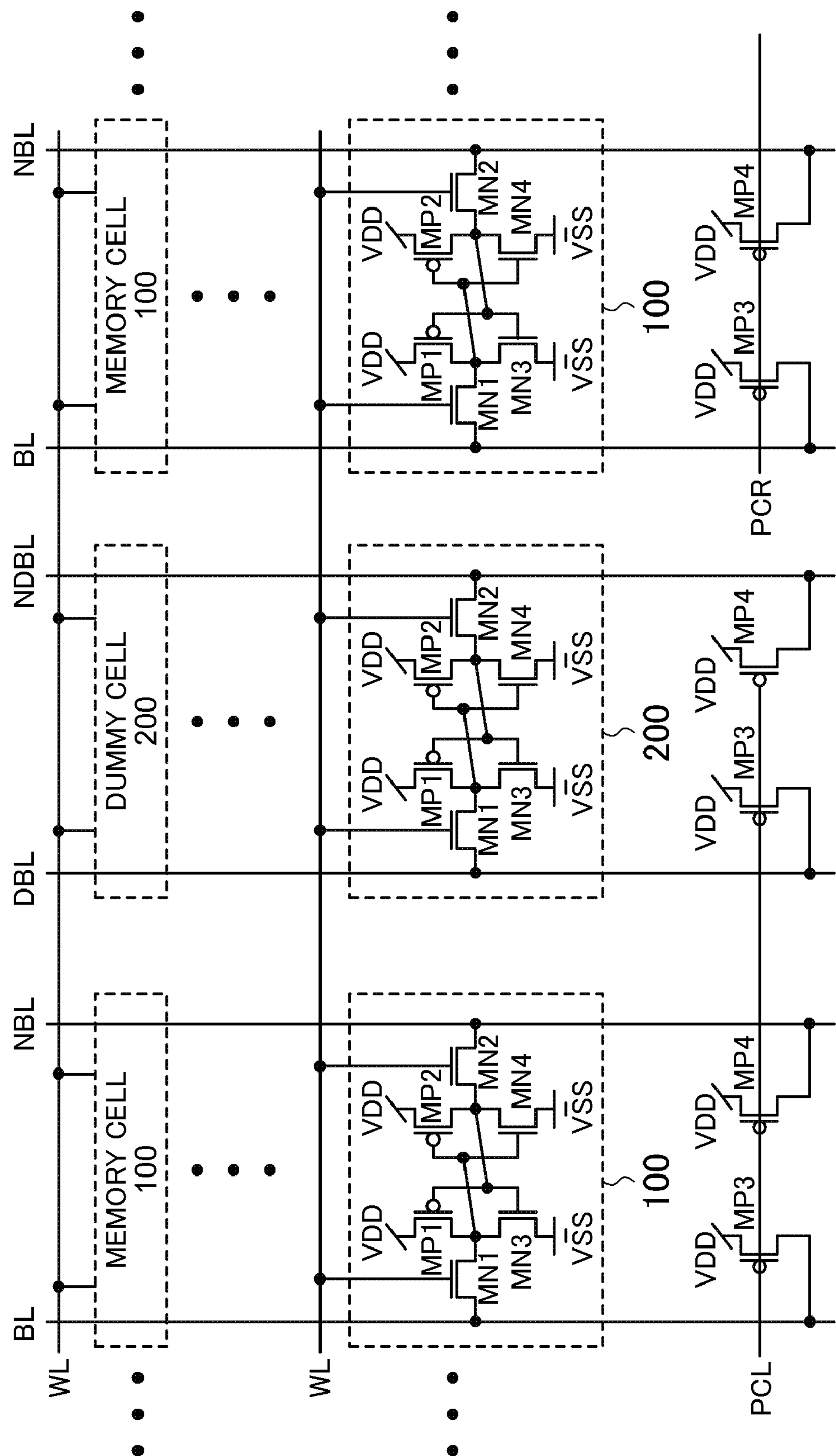
FIG. 13 is a circuit diagram of a sixth embodiment of the present disclosure.

FIG. 13 is a diagram of a configuration of an SRAM according to another embodiment of the present disclosure. Dummy bit lines DBL and NDBL of dummy cells 200 included in the dummy cell array 201 of FIG. 1 or 3 are precharged by precharge transistors MP3 and MP4 which have the same shape as that of precharge transistors MP3 and MP4 which precharge bit lines BL and NBL of memory cells 100. Reference characters PCL and PCR each indicate a bit line precharge signal. PCL corresponds to SIG0-SIGm−1, and PCR corresponds to SIGm-SIGm+n−1. Precharge transistors between the bit lines BL and NBL of the memory cells 100 and precharge transistors between the dummy bit lines DBL and NDBL of the dummy cells 200 have the same shape, and therefore, a repeating pattern can be used, resulting in a simple layout structure of the dummy bit lines DBL and NDBL of the dummy cells 200. This applies to memories, such as ROMs, DRAMs, etc., other than SRAMs.

Figure 14:
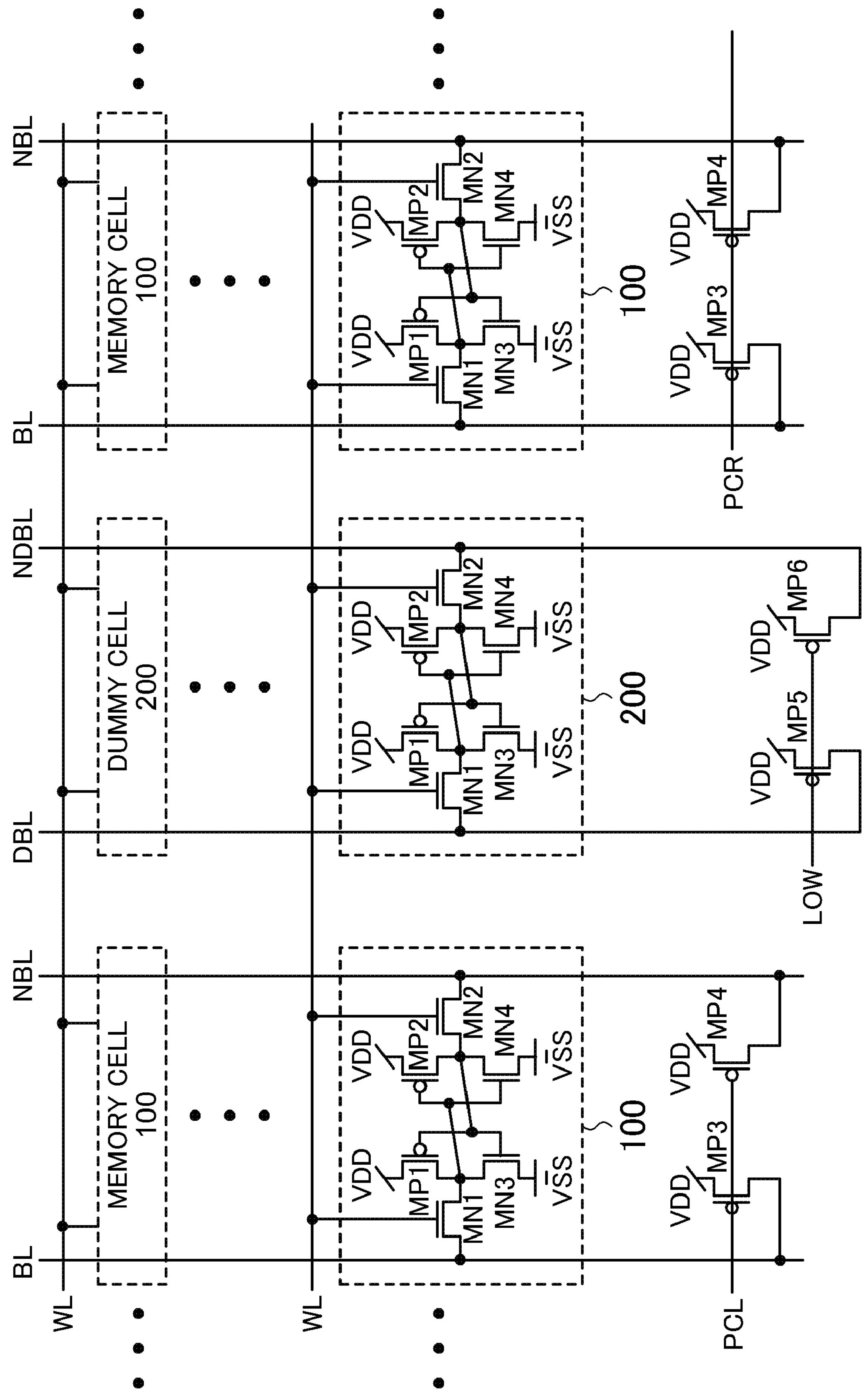
FIG. 14 is a circuit diagram of a seventh embodiment of the present disclosure.

FIG. 14 is a diagram of a configuration of an SRAM according to another embodiment of the present disclosure, in which the potentials of dummy bit lines DBL and NDBL of dummy cells 200 included in the dummy cell array 201 of FIG. 1 or 3 are fixed to VDD by transistors MP5 and MP6. As a result, the transistors MP5 and MP6 can be smaller than precharge transistors MP3 and MP4 which precharge bit lines BL and NBL of the memory cells 100, resulting in a reduction in the area. This applies to memories, such as ROMs, DRAMs, etc., other than SRAMs.

Figure 15:
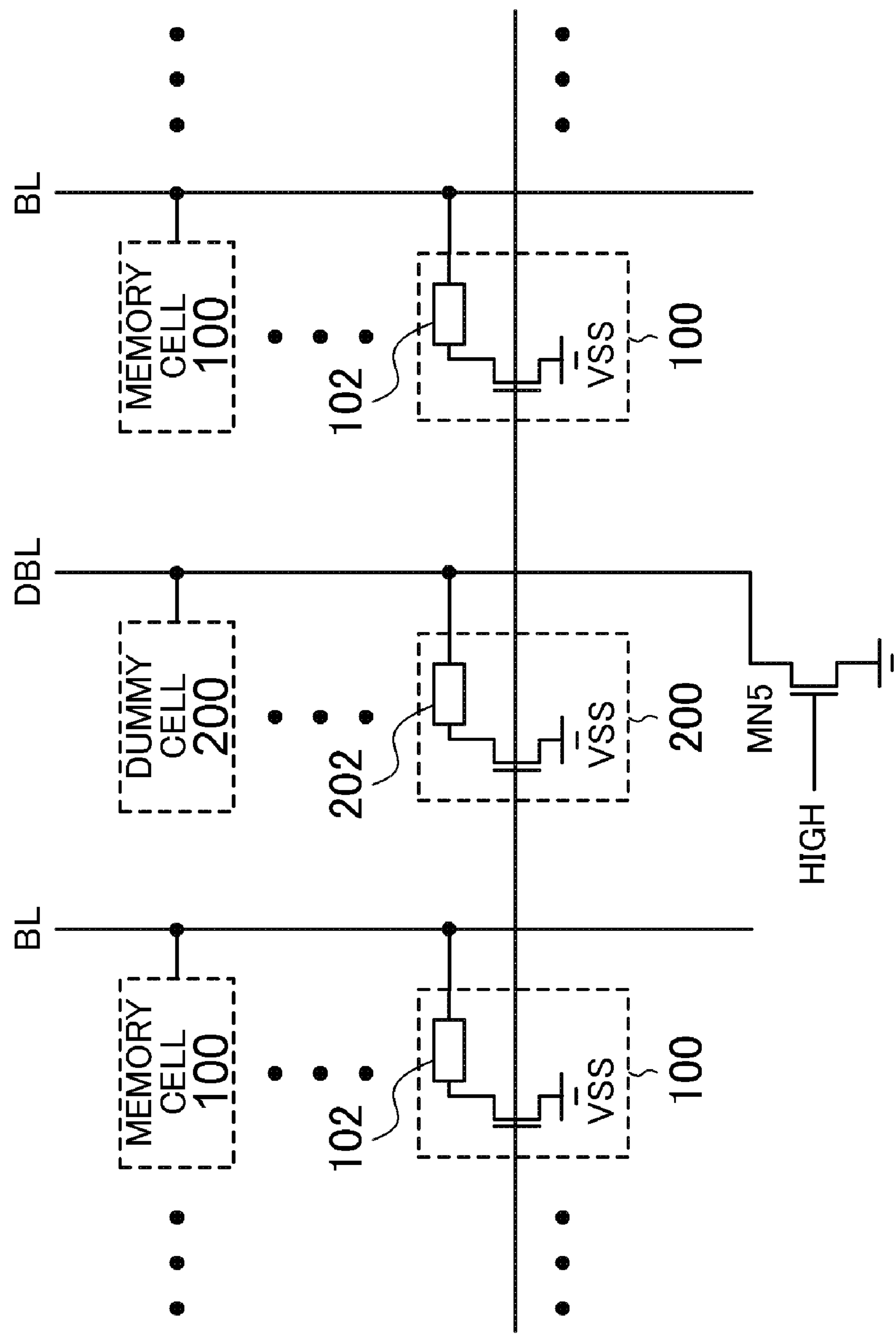
FIG. 15 is a circuit diagram of an eighth embodiment of the present disclosure.

FIG. 15 is a diagram showing a configuration of a ROM according to another embodiment of the present disclosure, in which the potential of a dummy bit line DBL of dummy cells 200 included in the dummy cell array 201 of FIG. 1 or 3 is fixed to VSS by a transistor MN5. A reference character 102 indicates a contact resistor of each memory cell 100, and a reference character 202 indicates a contact resistor of each dummy cell 200. As a result, a current does not flow through the dummy bit line DBL, resulting in a reduction in the power consumption. This applies to memories, such as DRAMs, etc., other than ROMs.

Figure 16:
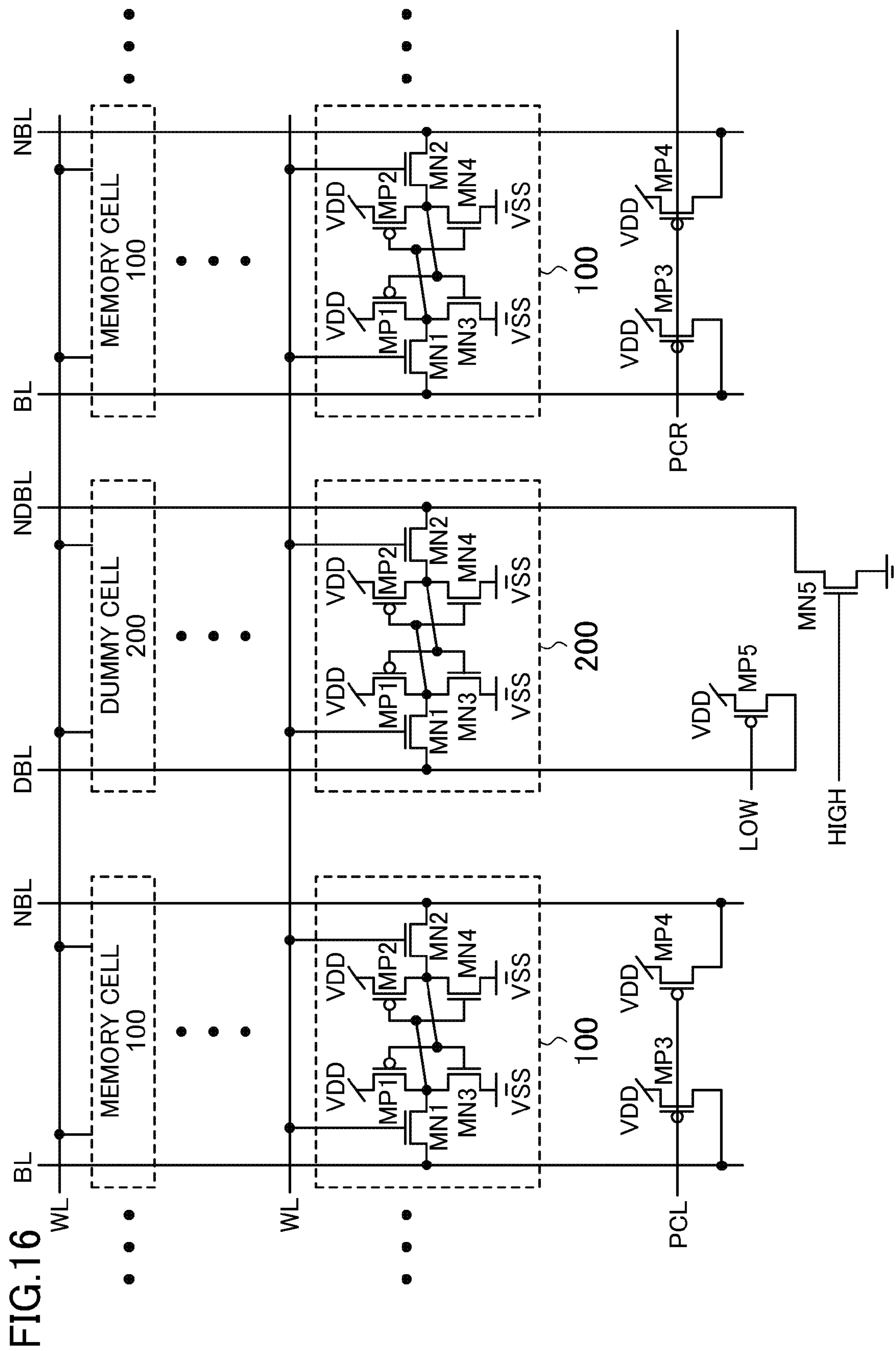
FIG. 16 is a circuit diagram of a ninth embodiment of the present disclosure.

FIG. 16 is a diagram of a configuration of an SRAM according to another embodiment of the present disclosure, in which the potential of dummy bit lines DBL and NDBL of dummy cells 200 included in the dummy cell array 201 of FIG. 1 or 3 are fixed to VDD and VSS by transistors MP5 and MN5, respectively. As a result, the transistors MP5 and MN5 can be smaller than precharge transistors MP3 and MP4 which precharge bit lines BL and NBL of the memory cells 100, resulting in a reduction in the area. In addition, a current does not flow through the dummy bit lines DBL and NDBL during operation, resulting in a reduction in the power consumption.

Figure 17:
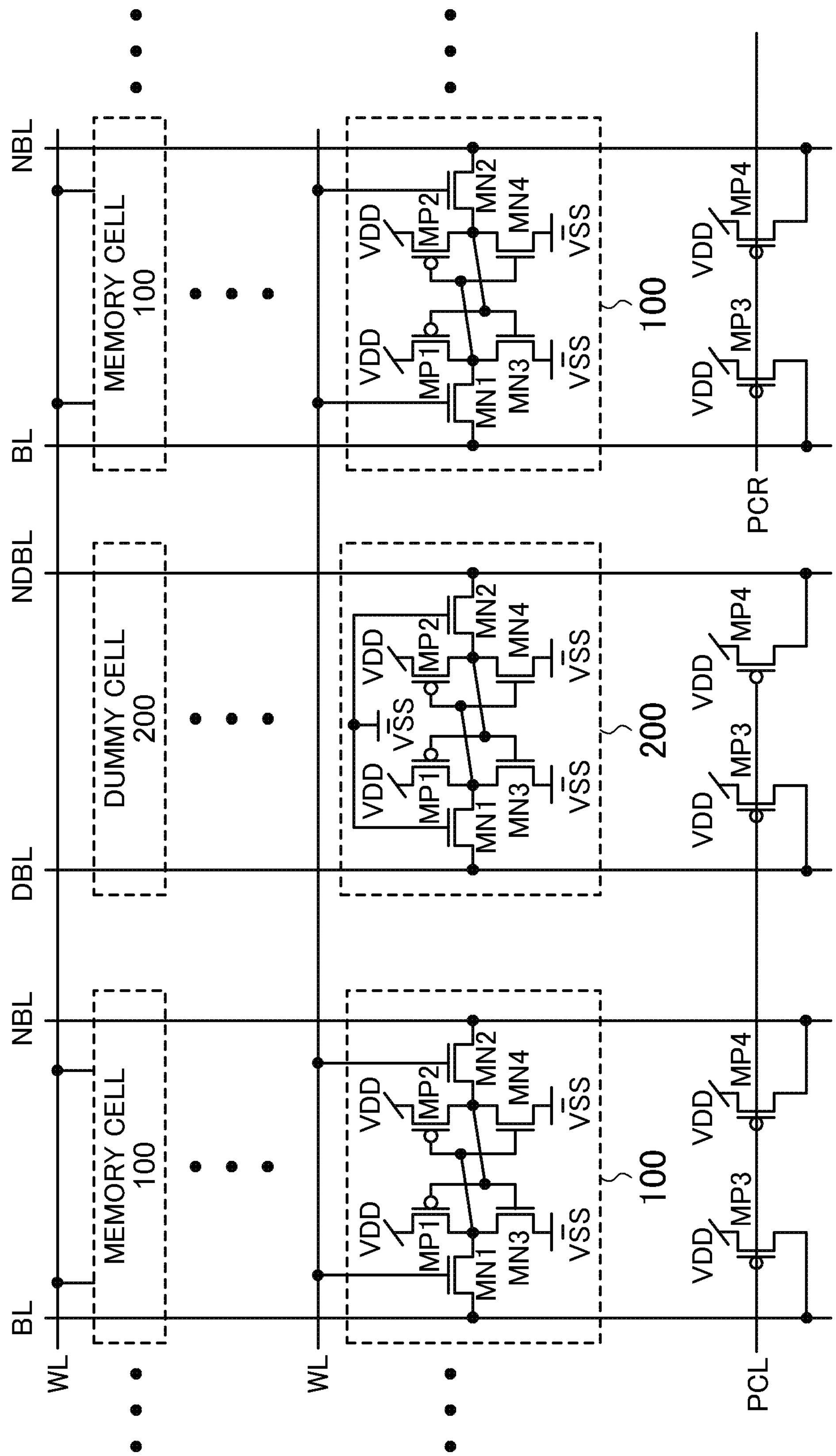
FIG. 17 is a circuit diagram of a tenth embodiment of the present disclosure.

FIG. 17 is a diagram of a configuration of an SRAM according to another embodiment of the present disclosure, in which dummy cells 200 included in the dummy cell array 201 of FIG. 1 or 3 are not connected to word lines WL. As a result, the load on the word lines WL is reduced, resulting in higher-speed operation. This applies to memories, such as ROMs, DRAMs, etc., other than SRAMs.

Figure 18:
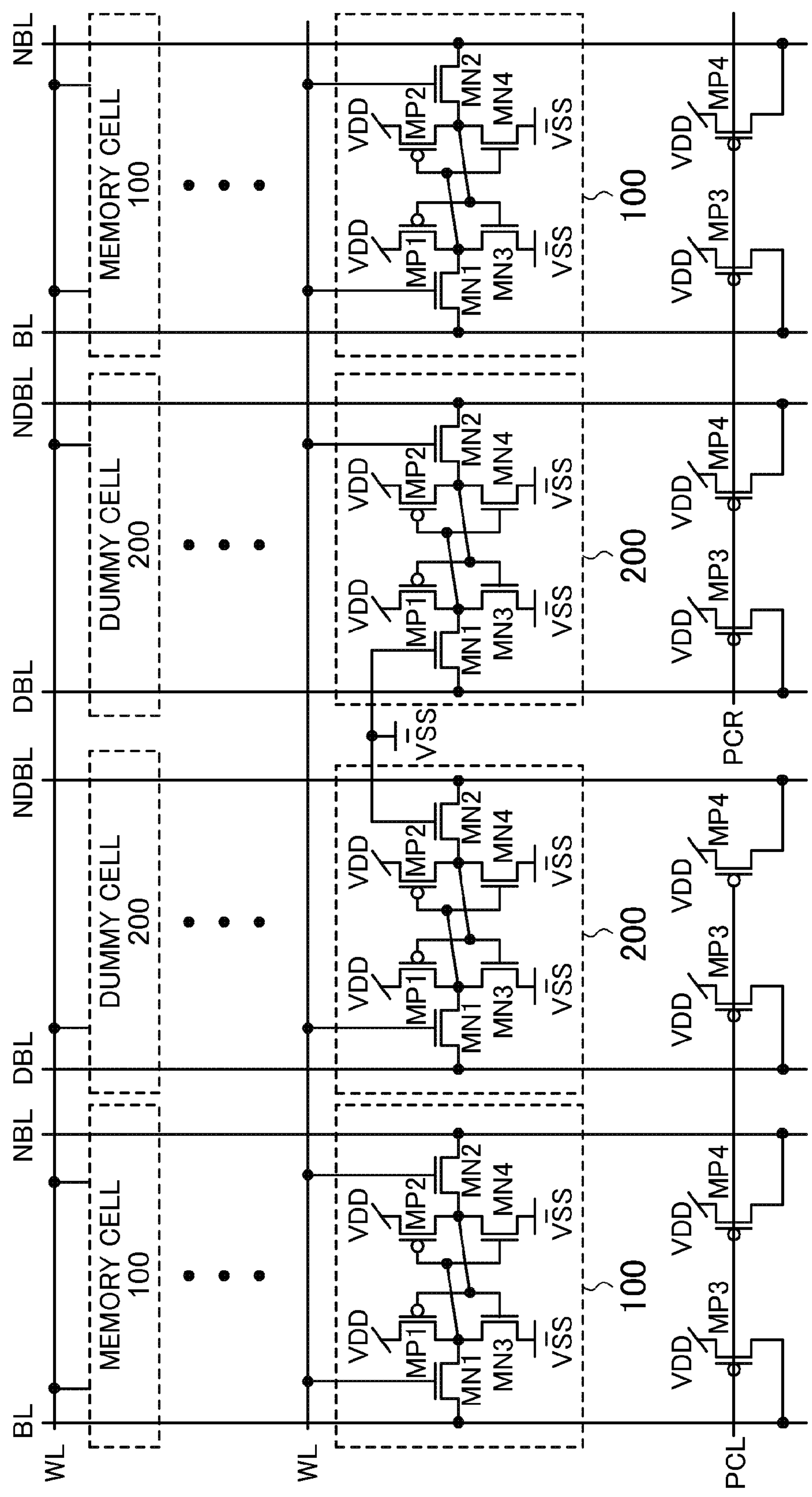
FIG. 18 is a circuit diagram of an eleventh embodiment of the present disclosure.

FIG. 18 is a diagram of a configuration of an SRAM according to another embodiment of the present disclosure, in which two lines of dummy cells 200 are provided in the dummy cell array 201 of FIG. 1 or 3, and one of two access transistors MN1 and MN2 of each dummy cell 200 is not connected to a word line WL. As a result, the load on the word line WL is reduced, resulting in higher-speed operation. This applies to memories other than SRAMs.

Figure 19:
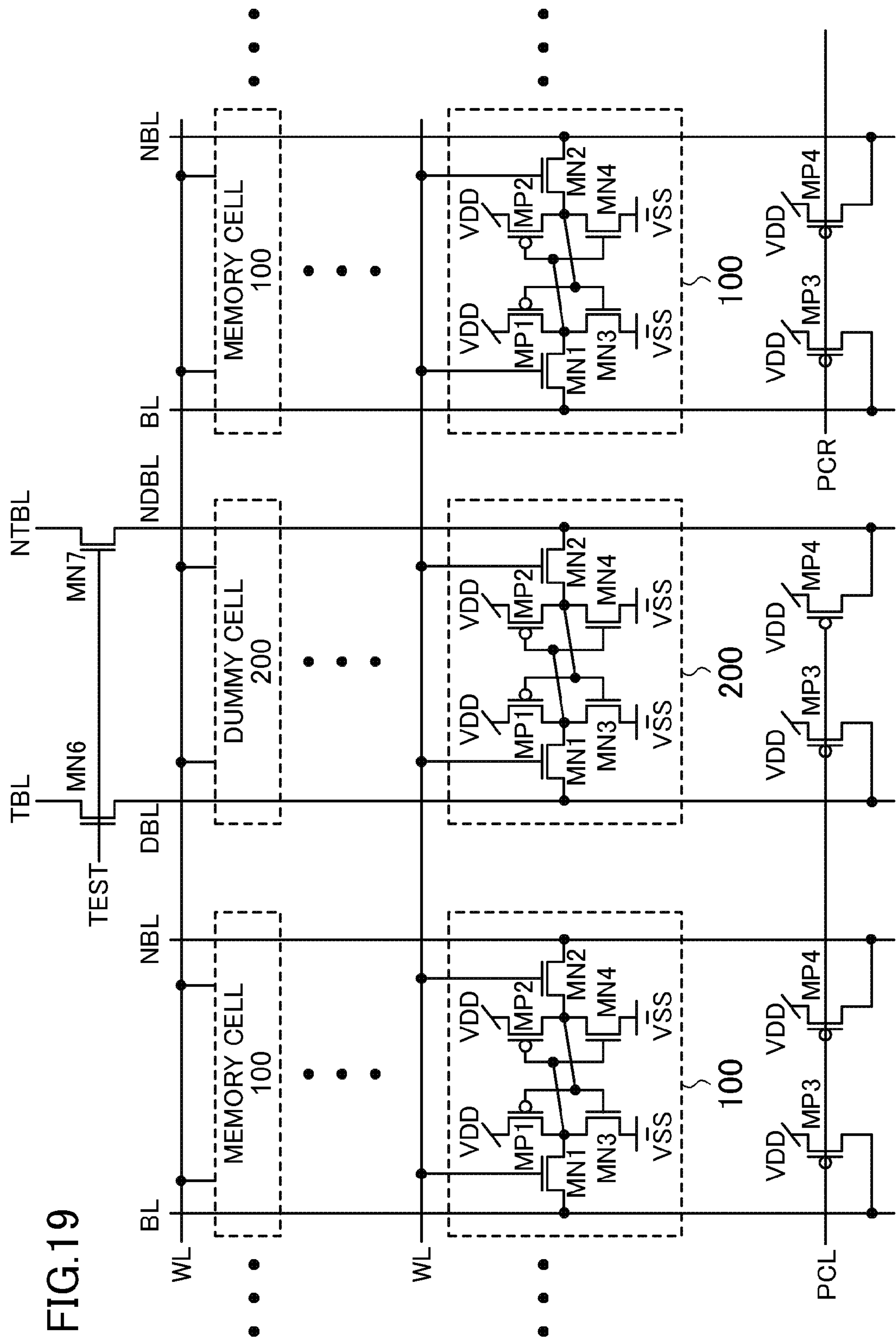
FIG. 19 is a circuit diagram of a twelfth embodiment of the present disclosure.

FIG. 19 is a diagram of a configuration of an SRAM according to another embodiment of the present disclosure, in which dummy bit lines DBL and NDBL of dummy cells 200 included in the dummy cell array 201 of FIG. 1 or 3 are connected to external terminals TBL and NTBL via transistors MN6 and MN7, respectively, and by causing a TEST terminal to transition high, a cell current can be measured at a position close to the memory cells 100 to manage or analyze a process directly from the outside. This applies to memories, such as ROMs, DRAMs, etc., other than SRAMs.

Figure 20:
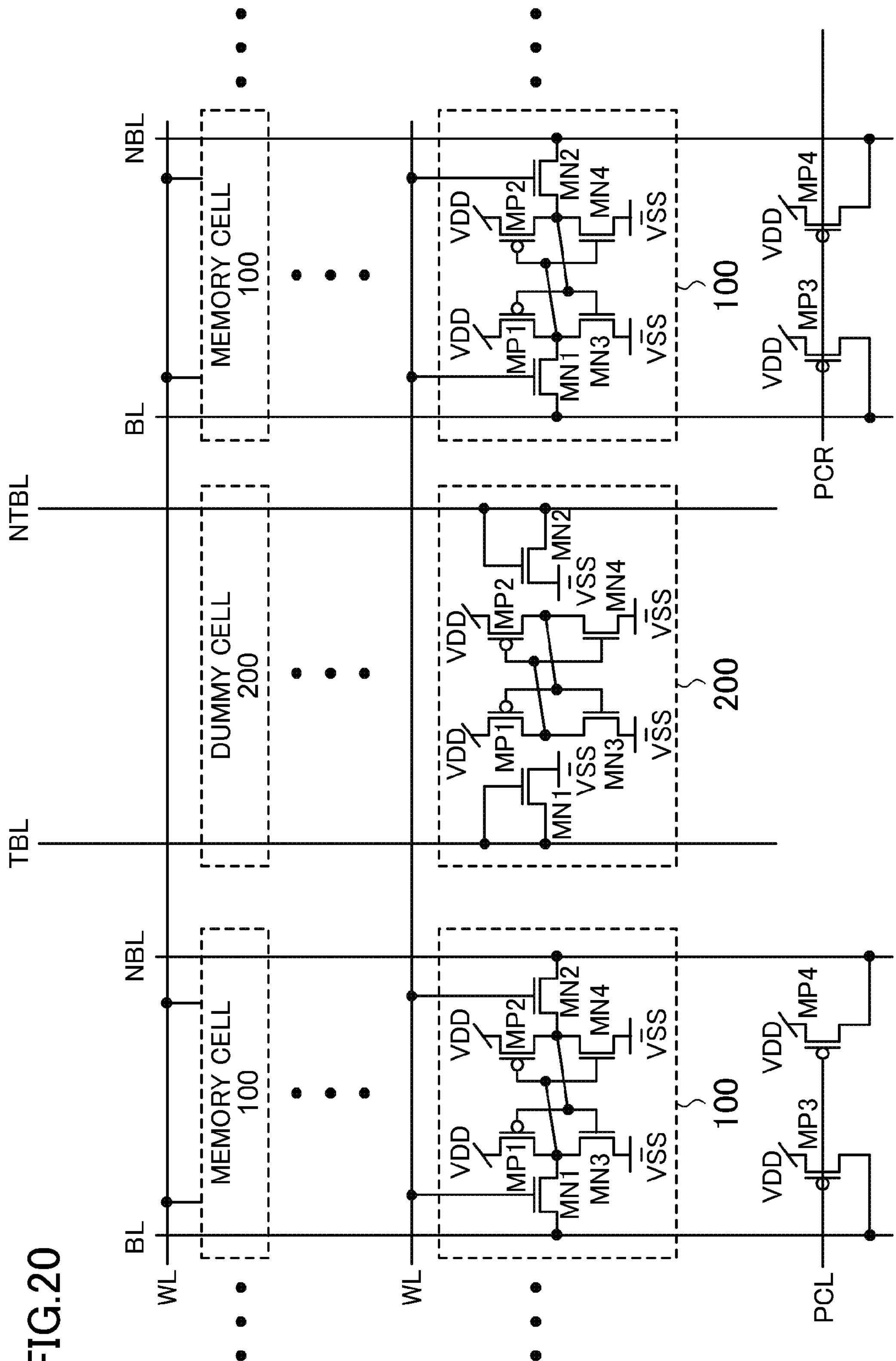
FIG. 20 is a circuit diagram of a thirteenth embodiment of the present disclosure.

FIG. 20 is a diagram of a configuration of an SRAM according to another embodiment of the present disclosure, in which the gates and drains of access transistors MN1 and MN2 of dummy cells 200 included in the dummy cell array 201 of FIG. 1 or 3 are connected to dummy bit lines TBL and NTBL, respectively, and the sources of the access transistors MN1 and MN2 are connected to VSS, and the dummy bit lines TBL and NTBL are connected to the outside of the SRAM. With this configuration, by causing the external terminals TBL and NTBL to transition high, currents and threshold voltages of the access transistors MN1 and MN2 of the dummy cells 200 can be measured at a position close to memory cells 100 to manage or analyze a process. This applies to memories, such as ROMs, DRAMs, etc., other than SRAMs.

Figure 21:
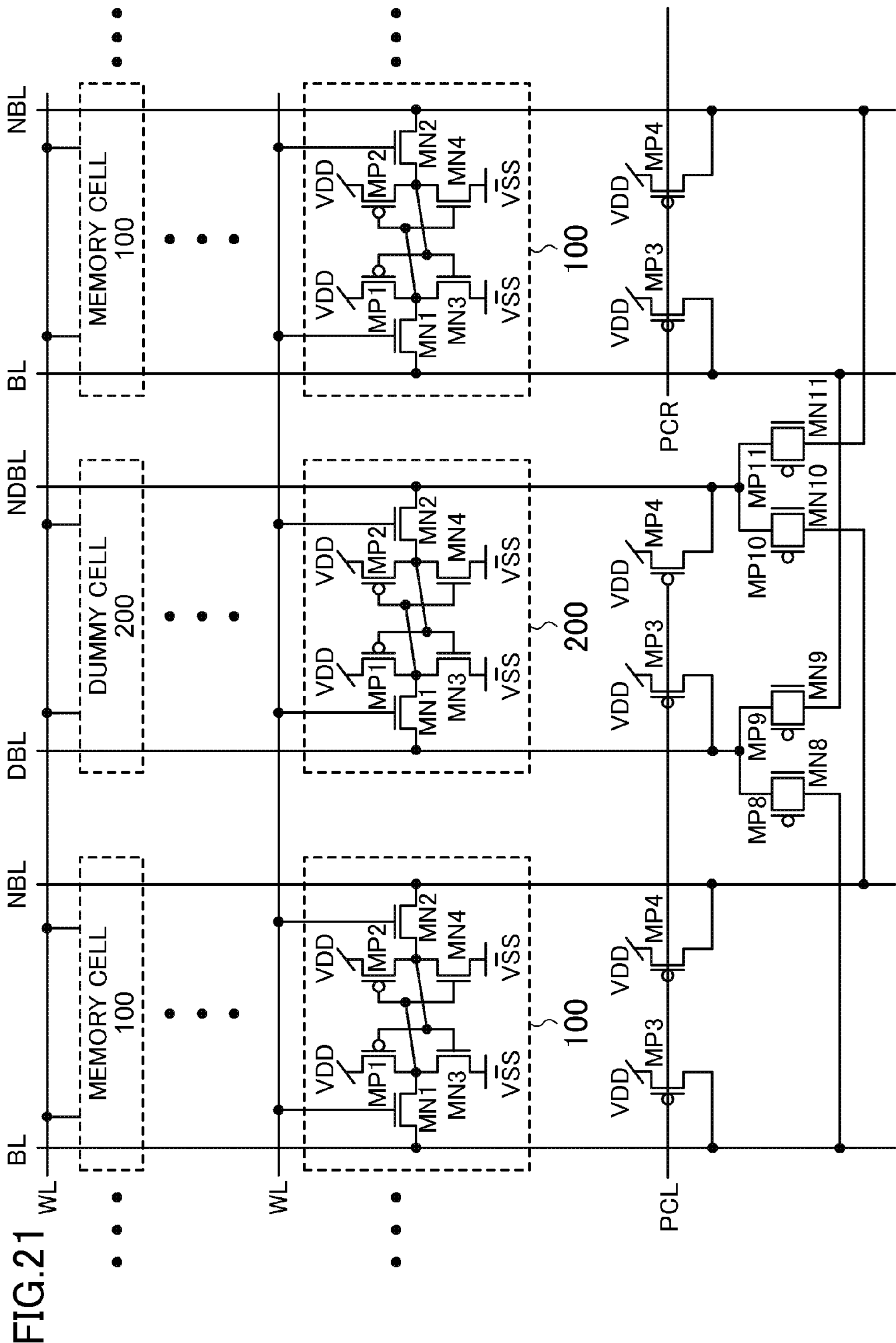
FIG. 21 is a circuit diagram of a fourteenth embodiment of the present disclosure.

FIG. 21 is a diagram of a configuration of an SRAM according to another embodiment of the present disclosure, in which a dummy bit line DBL of dummy cells 200 included in the dummy cell array 201 of FIG. 1 or 3 is connected via MP8 and MN8, and MP9 and MN9, to left and right bit lines BL, respectively, and a dummy bit line NDBL is connected via MP10 and MN10, and MP11 and MN11, to left and right bit lines NBL, respectively. With this configuration, the dummy cells 200 can be used as redundancy replacement cells, whereby the area can be reduced without providing an additional redundancy replacement cell. This applies to memories, such as ROMs, DRAMs, etc., other than SRAMs.

Figure 22:
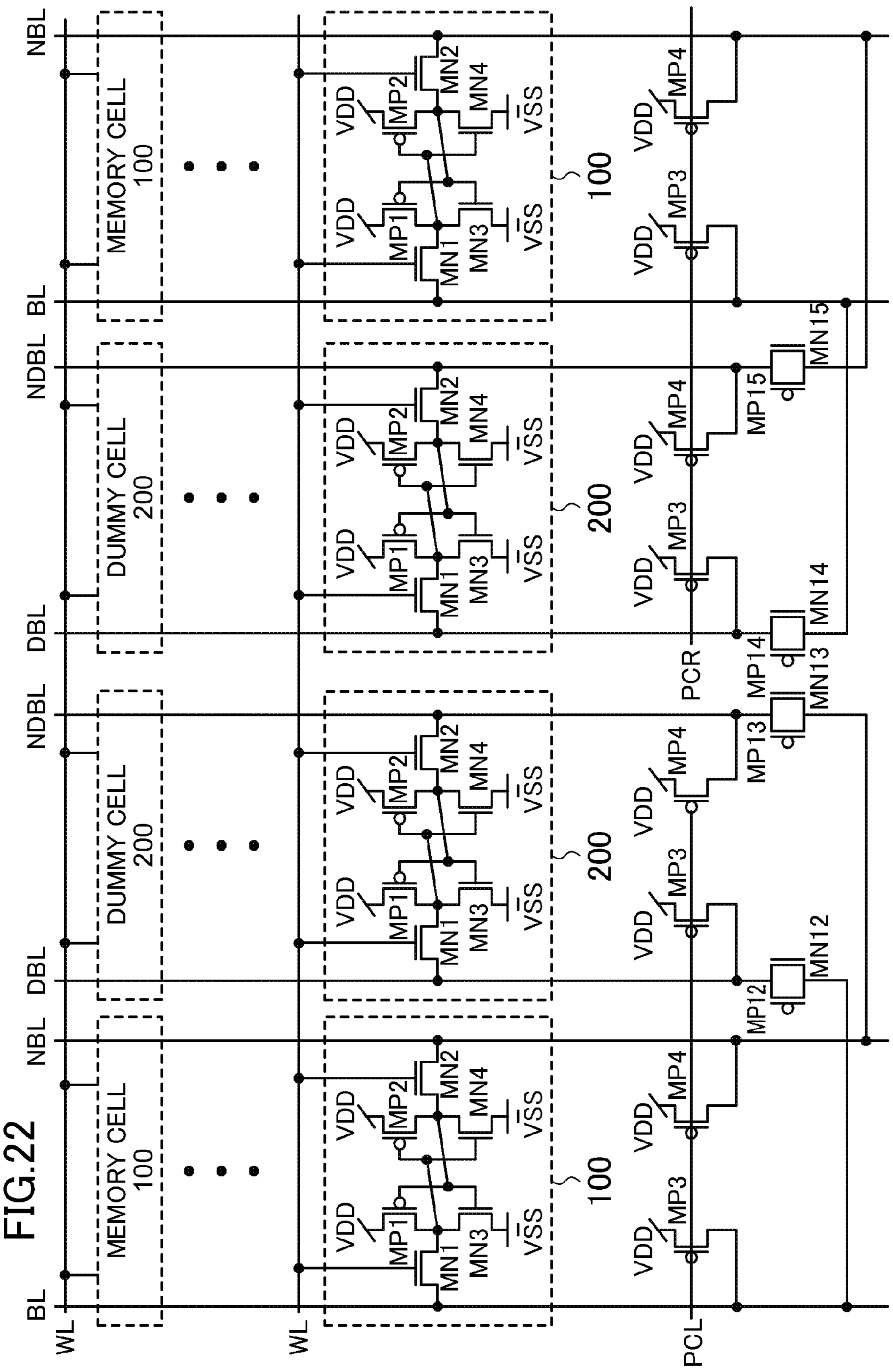
FIG. 22 is a circuit diagram of a fifteenth embodiment of the present disclosure.

FIG. 22 is a diagram of a configuration of an SRAM according to another embodiment of the present disclosure, in which two lines of dummy cells 200 are provided in the dummy cell array 201 of FIG. 1 or 3, and dummy bit lines DBL of the two lines of dummy cells 200 are connected via MP12 and MN12, and MP14 and MN14, to left and right bit lines BL, respectively, and dummy bit lines NDBL of the two lines of dummy cells 200 are connected via MP13 and MN13, and MP15 and MN15, to left and right bit lines NBL, respectively. With this configuration, the dummy cells 200 can be used as redundancy replacement cells, whereby the area can be reduced without providing an additional redundancy replacement cell. This applies to memories, such as ROMs, DRAMs, etc., other than SRAMs.

Figure 23:
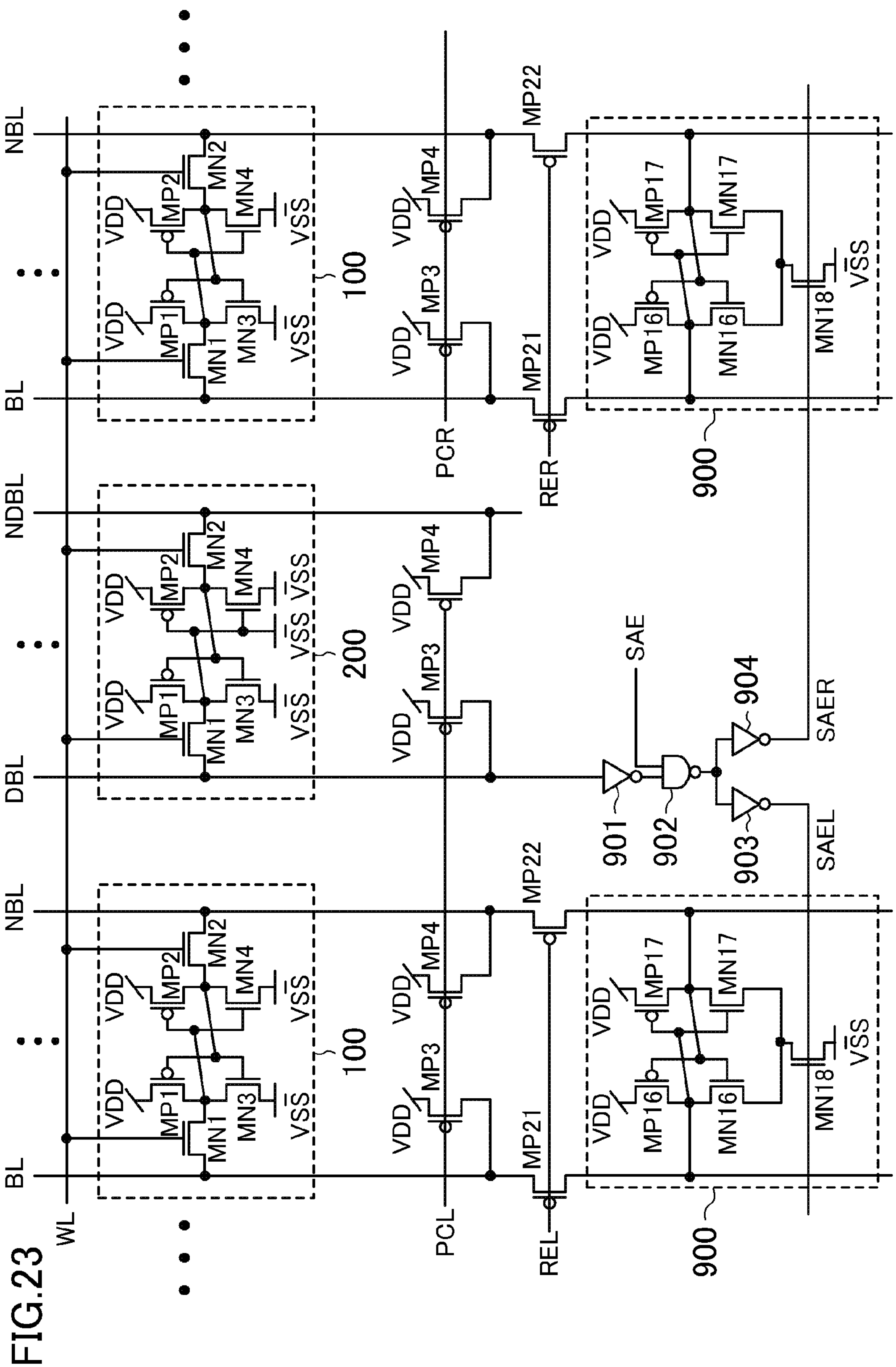
FIG. 23 is a circuit diagram of a sixteenth embodiment of the present disclosure.

FIG. 23 is a diagram of a configuration of an SRAM according to another embodiment of the present disclosure, in which the source of an access transistor MN1 of each of a portion of dummy cells 200 included in the dummy cell array 201 of FIG. 1 or 3 is connected to VSS. Reference characters 901, 903, and 904 each indicate an inverter circuit, and a reference character 902 indicates a NAND circuit. Bit lines BL and NBL of each memory cell 100 are connected via transistors MP21 and MP22, respectively, to a corresponding sense amplifier 900. Reference characters REL and RER each indicate a read activation signal. Logical ANDs SAEL and SAER of inverted data of the dummy bit line DBL and a sense amplifier activation signal SAE are connected to the respective corresponding sense amplifiers 900 each of which amplifies data of the corresponding memory cell 100. Note that each sense amplifier 900 includes two P-channel transistors MP16 and MP17 and three N-channel transistors MN16, MN17, and MN18.

Figure 24:
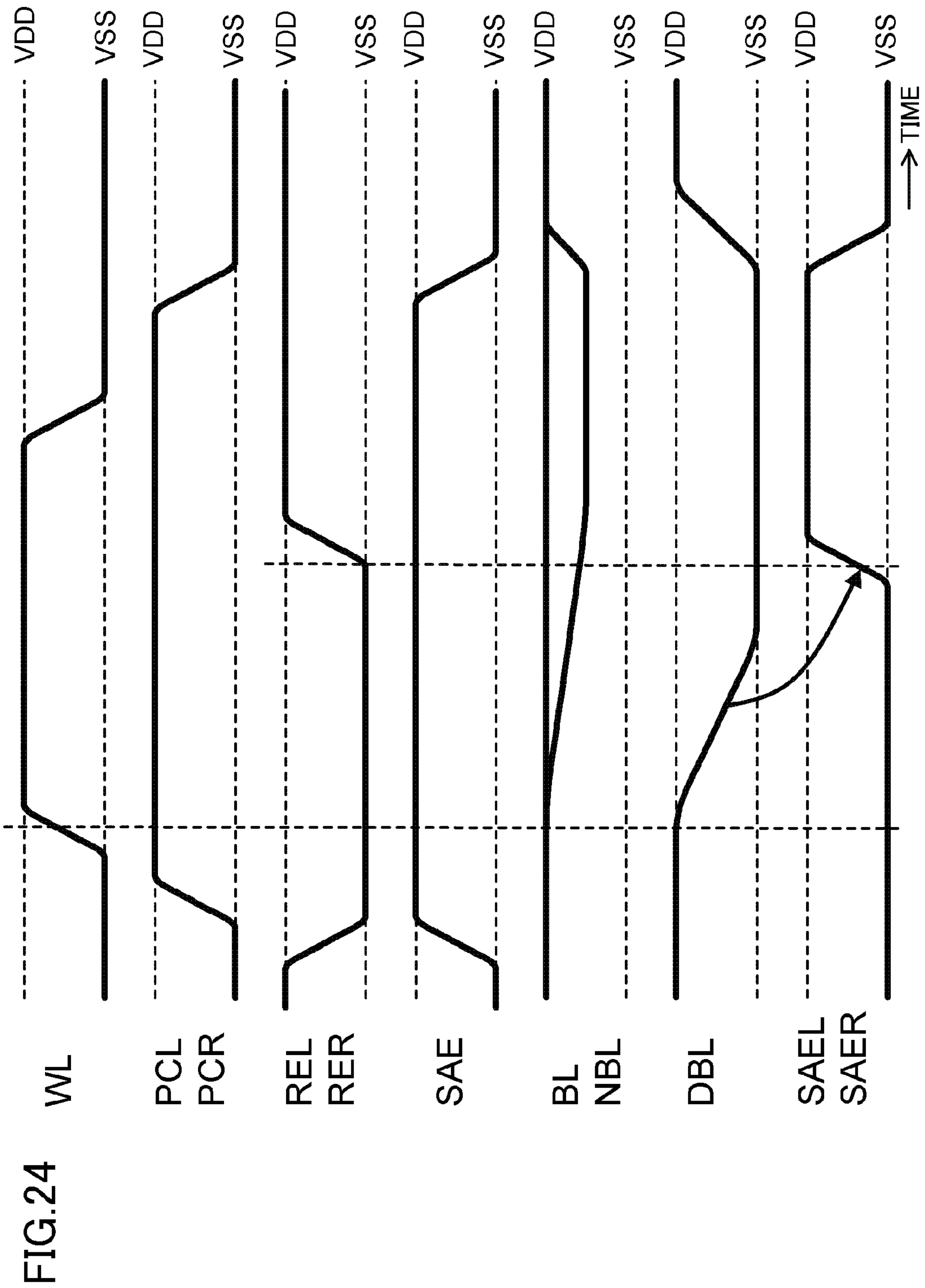
FIG. 24 is a circuit operation diagram of the sixteenth embodiment of the present disclosure.

FIG. 24 is a diagram of waveforms in the circuit of FIG. 23. Before a word line WL is activated, the potentials of the bit line precharge signals PCL and PCR are increased to VDD to disable precharge. Also, before the word line WL is activated, the potentials of the read activation signals REL and RER are decreased to VSS, and the potential of the sense amplifier activation signal SAE is increased to VDD. After the activation of the word line WL, the potential of the dummy bit line DBL decreases to VSS more quickly than the potentials of the bit lines BL and NBL. Next, SAEL and SAER are activated to activate the sense amplifier 900. In this case, an arbitrary number of dummy cells 200 having variations similar to those of the memory cells 100 are connected to the dummy bit line DBL, whereby the sense amplifier 900 can be activated with appropriate timing. This applies to memories, such as ROMs, DRAMs, etc., other than SRAMs.

In the semiconductor memory device of the present disclosure, dummy cells are provided in a memory cell array, and an intermediate buffer for buffering control signals for input/output circuits is provided between the input/output circuits, whereby the control signals of the input/output circuits can be operated at high speed while the shape continuity of the memory cells is maintained and the area increasing effect is reduced. Therefore, the semiconductor memory device of the present disclosure is useful.

What is claimed is:

1. A semiconductor memory device including:

a memory cell array including memory cells configured to store data and arranged in an array;

a first circuit configured to have at least one of a function of outputting data from the memory cells and a function of inputting data to the memory cells; and a second circuit configured to have at least one of a function of outputting data from the memory cells and a function of inputting data to the memory cells, wherein at least one line of dummy cells other than the memory cells configured to store the data is provided in the memory cell array and arranged in parallel with a bit line direction of the memory cells, and a buffer circuit configured to buffer a control signal to the first or second circuit is provided between the first and second circuits in a region extending in the bit line direction from the dummy cell line.

2. The semiconductor memory device of claim 1, wherein the dummy cells each have a substrate contact for the memory cell array.

3. The semiconductor memory device of claim 1, wherein the dummy cells each have the same shape as that of each of a portion of the memory cells.

4. The semiconductor memory device of claim 1, wherein a gate and a diffusion layer of each of the dummy cells have the same shape as that of each of the memory cells.

5. The semiconductor memory device of claim 1, wherein the dummy cells each include a first bit line, and the first bit line is connected to a precharge transistor having the same configuration as that of a precharge transistor configured to precharge a bit line possessed by the corresponding memory cell.

6. The semiconductor memory device of claim 1, wherein the dummy cells each include a first bit line, and the first bit line is set to a predetermined potential.

7. The semiconductor memory device of claim 1, wherein the dummy cells each include a first bit line and a second bit line, and the first bit line is set to a first potential, and the second bit line is set to a second potential.

8. The semiconductor memory device of claim 1, wherein the dummy cells each include at least one bit line, and at least one of one or more transistors connected to the at least one bit line is not connected to a word line configured to activate the memory cells.

9. The semiconductor memory device of claim 1, wherein the dummy cells each include a first bit line, and the first bit line is connected to the outside via a path different from a bit line of the memory cells.

10. The semiconductor memory device of claim 1, wherein the dummy cells are each a redundancy replacement cell for the memory cells.

11. The semiconductor memory device of claim 1, wherein an amplifier circuit configured to output data from the memory cells is activated based on data read out from the dummy cells.

* * * * *